United States Patent
Zhang et al.

(10) Patent No.: US 9,512,008 B2
(45) Date of Patent: Dec. 6, 2016

(54) FLUX COMPOSITION USEFUL IN DIRECTIONAL SOLIDIFICATION FOR PURIFYING SILICON

(71) Applicant: Silicor Materials Inc., San Jose, CA (US)

(72) Inventors: Chunhui Zhang, Mississauga (CA); Alain Turenne, Kitchener (CA); Christain Alfred, Brampton (CA)

(73) Assignee: Silicor Materials, Inc., San Jose, CA (US)

( * ) Notice: Subject to any disclaimer, the term of this patent is extended or adjusted under 35 U.S.C. 154(b) by 0 days.

(21) Appl. No.: 14/409,546

(22) PCT Filed: Jun. 25, 2013

(86) PCT No.: PCT/US2013/047511
§ 371 (c)(1),
(2) Date: Dec. 19, 2014

(87) PCT Pub. No.: WO2014/004441
PCT Pub. Date: Jan. 3, 2014

(65) Prior Publication Data
US 2015/0368114 A1    Dec. 24, 2015

Related U.S. Application Data

(60) Provisional application No. 61/663,887, filed on Jun. 25, 2012.

(51) Int. Cl.
*C01B 33/037* (2006.01)
*C30B 11/00* (2006.01)
*C30B 29/06* (2006.01)

(52) U.S. Cl.
CPC ............ *C01B 33/037* (2013.01); *C30B 11/00* (2013.01); *C30B 29/06* (2013.01)

(58) Field of Classification Search
CPC ......... C01B 33/037; C30B 29/06; C30B 11/00
See application file for complete search history.

(56) References Cited

U.S. PATENT DOCUMENTS

| | | | |
|---|---|---|---|
| 4,039,326 A | 8/1977 | Moschini | |
| 4,195,067 A * | 3/1980 | Kotval | ............... C01B 33/037 117/903 |
| 8,273,176 B2 | 9/2012 | Nichol | |
| 2007/0297968 A1 | 12/2007 | Fukuyama | |

FOREIGN PATENT DOCUMENTS

| | | |
|---|---|---|
| CN | 1199099 A | 11/1998 |
| CN | 101855391 A | 10/2010 |
| CN | 101905885 A | 12/2010 |

(Continued)

OTHER PUBLICATIONS

"Chinese Application Serial No. 201380043942.1, Office Action mailed Dec. 22, 2015", Without English Translation, 12 pgs.

(Continued)

*Primary Examiner* — Anthony J Zimmer
(74) *Attorney, Agent, or Firm* — Schwegman Lundberg & Woessner, P.A.

(57) ABSTRACT

The present invention provides for a flux composition, and the use thereof in a directional solidification for the purification of silicon.

20 Claims, 2 Drawing Sheets

(56) References Cited

FOREIGN PATENT DOCUMENTS

| | | | |
|---|---|---|---|
| CN | 102001662 A | | 4/2011 |
| CN | 102001662 A | * | 4/2011 |
| CN | 102134076 A | * | 7/2011 |
| CN | 102134076 A | | 7/2011 |
| CN | 102219219 A | | 10/2011 |
| CN | 102219221 A | | 10/2011 |
| CN | 102452837 A | | 5/2012 |
| CN | 102583386 A | | 7/2012 |
| EP | 1724238 A1 | | 11/2006 |
| JP | 51121435 A | | 10/1976 |
| JP | 04-37602 A | | 2/1992 |
| JP | 05330815 A | | 12/1993 |
| JP | 2010248042 A | | 11/2010 |
| TW | 200928019 A | | 7/2009 |
| WO | WO-89/02415 A1 | | 3/1989 |
| WO | WO-99/10275 A1 | | 3/1999 |
| WO | WO-2014/004441 A1 | | 1/2014 |

OTHER PUBLICATIONS

"Japanese Application Serial No. 2015-520384, Office Action mailed Jan. 6, 2016", (w/ English Translation), 8 pgs.
Database WPI Week 199914 Thomson Scientific, London, GB, AN 1999-154471, (Mar. 25, 2013), 1 pg.
"Chemical method for removing boron impurity from metallurgical silicon", Database CA [online]. Chemical Abstracts Service, Columbus, Ohio, US, retrieved from STN Database Accession No. 155:245203, (Aug. 18, 2011), 2 pgs.
"Database WPI Week 199212 Thomson Scientific, London, GB", AN 1992-093648, (Mar. 25, 2013), 1 pg.
"European Application Serial No. 13735147.4, Office Action mailed Feb. 17, 2015", 2 pgs.
"International Application Serial No. PCT/US2013/047511, International Preliminary Report on Patentability mailed Jan. 8, 2015", 10 pgs.
"International Application Serial No. PCT/US2013/047511, International Search Report mailed Nov. 14, 2013", 5 pgs.
"International Application Serial No. PCT/US2013/047511, Written Opinion mailed Nov. 14, 2013", 15 pgs.
"Taiwanese Application Serial No. 102121913 Response Filed Dec. 1, 2014 to Non Final Office Action mailed Jun. 5, 2014", (w/ English Translation of Claims), 5 pgs.
"Taiwanese Application Serial No. 102121913, Office Action mailed Jun. 5, 2014", (w/ English Translation), 12 pgs.
Li, Baiyu, et al., "Comprehensive method for removing boron, phosphorus and other impurities from industrial silicon by hydrometallurgy, oxidative slagging, and electron beam melting to obtain solar-grade polysilcon", Database CA. [online] Chemical Abstracts Service, Columbus, OH, retrieved from STN Database Accession No. 154:463017, (May 5, 2011), 2 pgs.
Chinese Application Serial No. 201380043942.1, Response filed May 6, 2016 to Office Action mailed Dec. 22, 2015, (w/ English Translation), 31 pgs.
Japanese Application Serial No. 2015-520384, Office Action mailed Jun. 15, 2016, (w/ English Translation), 5 pgs.
Japanese Application Serial No. 2015-520384, Response filed Mar. 28, 2016 to Office Action mailed Jan. 6, 2016, (w/ English Translation of Claims), 16 pgs.
Korean Application Serial No. 10-2015-7001837, Office Action mailed Jun. 15, 2016, (w/ English Translation), 9 pgs.

* cited by examiner

FLUX COMPOSITION USEFUL IN DIRECTIONAL SOLIDIFICATION FOR PURIFYING SILICON

RELATED APPLICATIONS

This application is a U.S. National Stage Filing under 35 U.S.C. §371 from International Application No. PCT/US2013/047511, entitled "FLUX COMPOSITION USEFUL IN DIRECTIONAL SOLIDIFICATION FOR PURIFYING SILICON," filed on Jun. 25, 2013, and published as WO 2014/004441 A1on Jan. 3, 2014, which claims the benefit of priority to U.S. Provisional Application No. 61/663,887, filed Jun. 25, 2012, which are hereby incorporated by reference in their entireties.

BACKGROUND

Solar cells are currently utilized as an energy source by using their ability to convert sunlight to electrical energy. Silicon is used almost exclusively as the semiconductor material in such photovoltaic cells. A significant limitation currently on the use of solar cells has to do with the cost of purifying silicon to solar grade (SG). In view of current energy demands and supply limitations, there is an enormous need for a more cost efficient way of purifying metallurgical grade (MG) silicon (or any other silicon having greater impurities than solar grade) to solar grade silicon.

SUMMARY

The present invention provides a composition that includes: (a) silicon dioxide ($SiO_2$); (b) sodium carbonate ($Na_2CO_3$); (c) optionally calcium oxide (CaO); and (d) at least one of calcium fluoride ($CaF_2$) and calcium chloride ($CaCl_2$).

The present invention also provides a composition that includes: (a) silicon dioxide ($SiO_2$), present in about 50 wt. %, ±50%; (b) sodium carbonate ($Na_2CO_3$), present in about 47 wt. %, ±20%; (c) optionally calcium oxide (CaO), present in up to about 6 wt. %; and (d) at least one of calcium fluoride ($CaF_2$) and calcium chloride ($CaCl_2$), when present, each is independently present in up to about 5.00 wt. %.

The present invention also provides a composition that includes: (a) silicon dioxide ($SiO_2$), present in about 42.70 wt. %, ±10%; (b) sodium carbonate ($Na_2CO_3$), present in about 50.60 wt. %, ±10%; (c) calcium oxide (CaO), present in about 1.70 wt. %, ±10%; (d) at least one of calcium fluoride ($CaF_2$) and calcium chloride ($CaCl_2$), when present, each is independently present in about 5.00 wt. %, ±20%.

The present invention also provides a composition that includes: (a) silicon dioxide ($SiO_2$), present in about 35 wt. % to about 80 wt. % of the composition; (b) sodium carbonate ($Na_2CO_3$), present in about 40 wt. % to about 55 wt. % of the composition; (c) optionally calcium oxide (CaO), present in up to about 6 wt. % of the composition; and (d) at least one of calcium fluoride ($CaF_2$) and calcium chloride ($CaCl_2$), when present, each is independently present in about 0.50 wt. % to about 6.00 wt. % of the composition.

The present invention also provides a composition that includes: (a) silicon dioxide ($SiO_2$), present in about 35 wt. % to about 50 wt. % of the composition; (b) sodium carbonate ($Na_2CO_3$), present in about 45 wt. % to about 55 wt. % of the composition; (c) calcium oxide (CaO), present in about 1.50 wt. % to about 1.90 wt. % of the composition; and (d) at least one of calcium fluoride ($CaF_2$) and calcium chloride ($CaCl_2$), when present, each is independently present in about 4.00 wt. % to about 6.00 wt. % of the composition.

The present invention also provides a method that includes: (a) forming a molten liquid from silicon and a flux, the flux including the composition described herein; (b) forming a slag, from the flux and impurities in the molten liquid and; and (c) optionally removing at least a portion of the slag from the molten liquid, to provide a purified molten liquid.

The present invention also provides a method that includes: (a) forming a molten liquid from silicon and a flux, the flux including the composition described herein; (b) forming a slag, from the flux and impurities in the molten liquid; (c) optionally removing at least a portion of the slag from the molten liquid; (d) directionally solidifying the molten liquid, to form solid silicon; and (e) removing a portion of the solid silicon, to provide purified solid silicon. In specific embodiments, the molten slag forms a protection layer on the surface of the furnace inner liner to prevent contamination of impurities from the inner liner refractory into the molten silicon.

DETAILED DESCRIPTION

The following detailed description includes references to the accompanying drawings, which form a part of the detailed description. The drawings show, by way of illustration, specific embodiments in which the invention may be practiced. These embodiments, which are also referred to herein as "examples," are described in enough detail to enable those skilled in the art to practice the invention. The embodiments may be combined, other embodiments may be utilized, or structural, and logical changes may be made without departing from the scope of the present invention. The following detailed description is, therefore, not to be taken in a limiting sense, and the scope of the present invention is defined by the appended claims and their equivalents.

In this document, the terms "a" or "an" are used to include one or more than one and the term "or" is used to refer to a nonexclusive "or" unless otherwise indicated. In addition, it is to be understood that the phraseology or terminology employed herein, and not otherwise defined, is for the purpose of description only and not of limitation. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

In the methods of manufacturing described herein, the steps can be carried out in any order without departing from the principles of the invention, except when a temporal or operational sequence is explicitly recited. Recitation in a claim to the effect that first a step is performed, then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" shall be construed to mean step A is carried out first, step E is carried out last, and steps B, C, and D can be carried out in any sequence between steps A and E, and that the sequence still falls within the literal scope of the claimed process. A given step or sub-set of steps may also be repeated.

Furthermore, specified steps can be carried out concurrently unless explicit claim language recites that they be carried out separately. For example, a claimed step of doing X and a claimed step of doing Y can be conducted simultaneously within a single operation, and the resulting process will fall within the literal scope of the claimed process.

Definitions

As used herein, "silicon dioxide" also known as silica, is an oxide of silicon with the chemical formula $SiO_2$.

As used herein, "sodium carbonate" also known as washing soda or soda ash, is a sodium salt of carbonic acid with the chemical formula $Na_2CO_3$. The sodium carbonate is employed in the compositions (e.g., flux) and methods herein, to decompose with heat in the molten liquid. Upon decomposition, the sodium carbonate will evolve carbon dioxide. As such, it is appreciated that those of skill in the art of chemistry understand and appreciate that in various embodiments, reference to "sodium carbonate" can include those compounds (e.g., carbonates or bicarbonates) that can decompose with heat in the molten liquid, to provide sodium oxide ($Na_2O$) and/or to evolve carbon dioxide. Such compounds include, e.g., sodium bicarbonate ($NaHCO_3$).

As used herein, "calcium oxide" commonly known as quicklime or burnt lime, is an inorganic compound with the chemical formula CaO. The calcium oxide is employed in the compositions (e.g., flux) and methods herein, to form an oxide anion ($O^-$) in the molten liquid. As such, it is appreciated that those of skill in the art of chemistry understand and appreciate that in various embodiments, reference to "calcium oxide" can include those compounds (e.g., metal oxides) that can form an oxide anion ($O^-$) in the molten liquid. Such compounds include, e.g., magnesium oxide (MgO).

As used herein, "calcium fluoride" is an inorganic compound with the formula $CaF_2$. The calcium fluoride is employed in the compositions (e.g., flux) and methods herein, to provide a source of calcium cation ($Ca^+$) and/or fluorine anion ($F^-$) in the molten liquid. As such, it is appreciated that those of skill in the art of chemistry understand and appreciate that in various embodiments, reference to "calcium fluoride" can include those compounds (e.g., calcium halides) that can form an alkali cation ($Ca^+$) and/or halogen anion ($F^-$) in the molten liquid. Such compounds include, e.g., calcium chloride ($CaCl_2$) (e.g., calcium cation ($Ca^+$) and chlorine anion ($Cl^-$).

As used herein, "purifying" refers to the physical separation of a substance of interest from one or more foreign or contaminating substances. In contrast, "impurities" or "impurity" refers to the one or more foreign or contaminating substances, other than silicon, that are undesirable.

As used herein, "flux" refers to a chemical cleaning agent, flowing agent, or purifying agent. In the process of forming a molten liquid in the melt of silicon, inorganic compounds (e.g., silicon dioxide, sodium carbonate, calcium oxide and calcium fluoride) can be considered a "flux" when added to the molten liquid, and of rendering slag. The slag is a mixture of impurities. As such, the flux is used to remove impurities from the molten liquid, and/or for adding desirable trace elements.

As used herein, a "slag" refers to a mixture of impurities formed in a molten liquid. The slag is typically formed by the addition of a flux to the molten liquid. As such, the slag can include a reaction product formed from impurities in the molten liquid (initially from the source silicon) and the flux. The slag will typically form on the surface of the molten liquid, where it can subsequently be removed.

As used herein, "molten" or "molten liquid" refers to one or more substances, together, that are melted.

As used herein, "melting" refers to the process of heating one or more solid substances to a point (called the melting point), or above, where they turn into a liquid. As such, the "melting" refers to a substance changing from a solid to a liquid, when exposed to sufficient heat.

As used herein, a "reaction product" refers to a compound formed by the chemical reaction of two or more substances. For example, impurities in the molten liquid (from the initial silicon source) can react with one or more substances in the flux, to form one or more reaction products.

As used herein, "solidifying" refers to the process of cooling one or more liquid substances (e.g., molten liquid) below a point (called the freezing point), where they turn into a solid. As such, the "solidifying" refers to a substance changing from a liquid to a solid, upon cooling.

As used herein, "removing" refers to the process of separating a substance from another substance (e.g., removing a solid or a liquid from a mixture) or separating a portion of a substance from another portion (e.g., removing a part of a solid from another part of the solid). The process can employ any technique known to those of skill in the art, e.g., decanting the mixture, skimming one or more liquids from the mixture, centrifuging the mixture, filtering the solids from the mixture, cutting a solid to remove a portion thereof, or a combination thereof.

As used herein, "aluminum" refers to the chemical element that has the symbol Al and atomic number 13. The term includes metal aluminum or elemental aluminum ($Al^0$), or an alloy thereof.

As used herein, "boron" refers to the chemical element that has the symbol B and atomic number 5. The term includes compounds that include boron (i.e., boron-containing compounds that include $B^{3+}$, $B^{2+}$, or $B^+$), and combinations thereof.

As used herein, "silicon" refers to the chemical element that has the symbol Si and atomic number 14. The term includes metal or elemental silicon ($Si^0$), or an alloy thereof.

As used herein, "metallurgical grade silicon" or "MG silicon" refers to relatively pure (e.g., at least about 98.0 wt. %) silicon.

As used herein, "upgraded metallurgical grade silicon" or "UMG silicon" refers to a relatively intermediate pure (e.g., at least about 99.0 wt. %) silicon.

As used herein, "solar grade silicon" or "SOG silicon" refers to a relatively high pure (e.g., at least about 99.9999 wt. %) silicon.

As used herein, "crystalline" includes the regular, geometric arrangement of atoms in a solid. As such, "silicon crystals" refers to silicon having regular, geometric arrangement of the silicon atoms in a solid state.

As used herein, "directionally solidifying" refers to the solidification of molten metal so that feed metal is continually available for the portion undergoing solidification.

As used herein, "polycrystalline silicon" or "poly-Si" refers to a material consisting of multiple silicon crystals.

As used herein, "monocrystalline silicon" refers to silicon that has a single and continuous crystal lattice structure.

As used herein, "ingot" refers to a mass of material cast into a shape which is relatively easy to handle and transport. For example, metal heated past its melting point and molded into a bar or block is referred to as an ingot.

As used herein, "boule" refers to a single-crystal ingot synthetically produced. For example, in the Czochralski or "CZ" process, a seed crystal is used to create a larger crystal, or ingot. This seed crystal is dipped into the pure molten silicon and slowly extracted. The molten silicon grows on the seed crystal in a crystalline fashion. As the seed is extracted the silicon sets and eventually a large, circular boule is produced.

As used herein, "contacting" refers to the act of touching, making contact, or of bringing substances into immediate proximity.

As used herein, "decanting" or "decantation" includes pouring off a fluid, leaving a sediment or precipitate, thereby separating the fluid from the sediment or precipitate. The sediment or precipitate can be present as a slag.

As used herein, "filtering" or "filtration" refers to a mechanical method to separate solids from liquids by passing the feed stream through a porous sheet such as a ceramic or metal membrane, which retains the solids and allows the liquid to pass through. This can be accomplished by gravity, pressure or vacuum (suction). The filtering effectively separates the sediment and/or precipitate from the liquid. The solids can be present as a slag.

Figure 1:
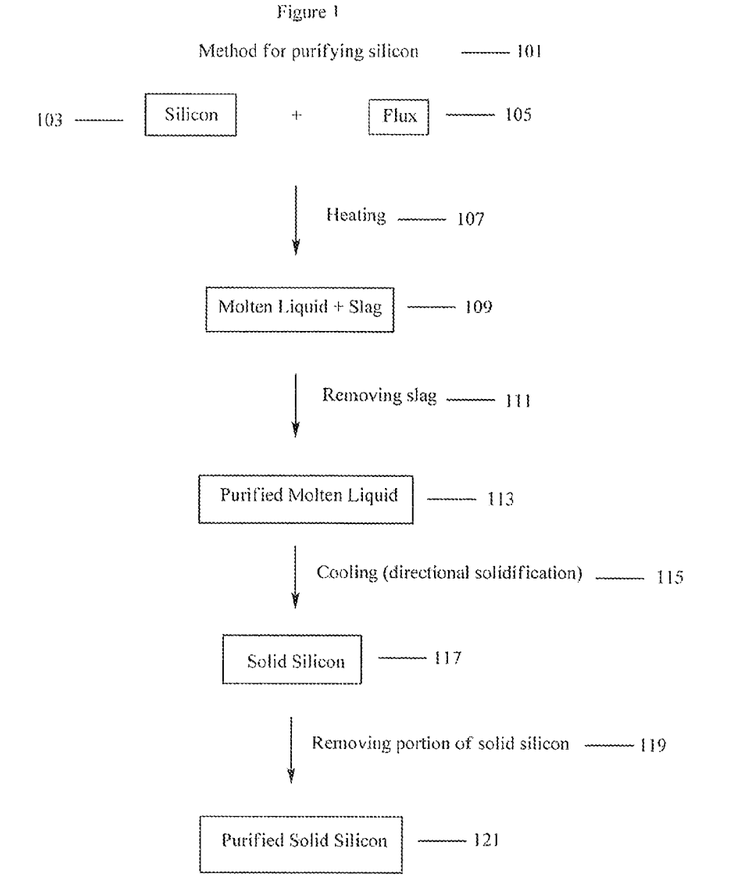
FIG. 1 illustrates a block flow diagram of a method for purifying silicon.

Referring to FIG. 1, an example of a block flow diagram of a method for purifying silicon 101 is shown, according to some embodiments. A molten liquid that includes a slag 109 is formed by heating 107 silicon 103 and a flux 105. The slag is removed 111 from the molten liquid, to provide purified molten liquid 113. The purified molten liquid 113 is cooled (directional solidification) 115, to provide a solid silicon 117. A portion of the solid silicon 117 is removed 119, to provide purified solid silicon 121.

Figure 2:
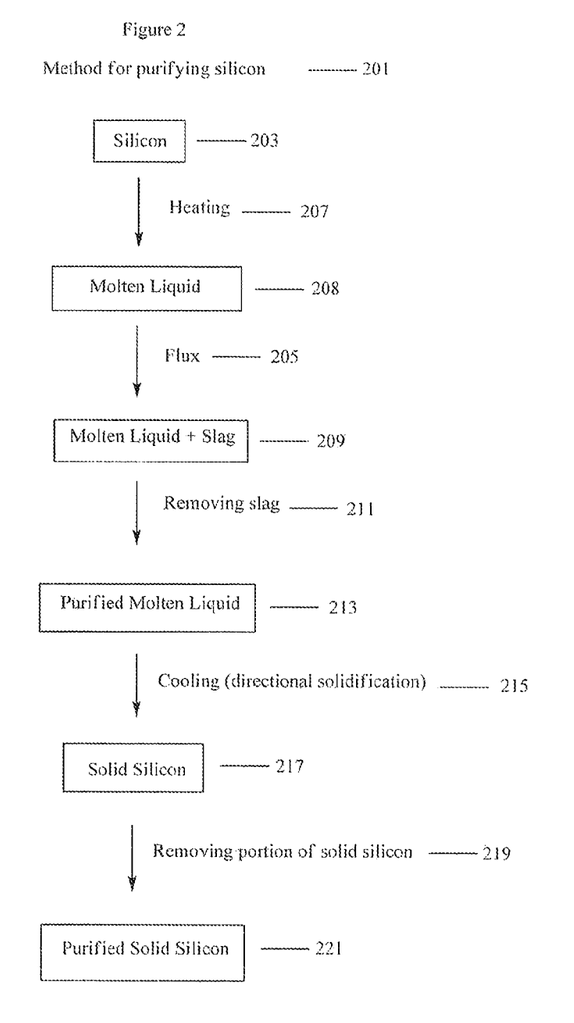
FIG. 2 illustrates a block flow diagram of a method for purifying silicon.

Referring to FIG. 2, an example of a block flow diagram of a method for purifying silicon 201 is shown, according to some embodiments. A molten liquid 208 is formed by heating 207 silicon 203. Flux 205 is added to the molten liquid 208, to allow slag to form in the molten liquid 209. The slag is removed 211 from the molten liquid, to provide a purified molten liquid 213. The purified molten liquid 213 is cooled 215, to provide solid silicon 217. A portion of the solid silicon 217 is removed 219, to provide purified solid silicon 221.

Silicon 103 or 203 for processing may be obtained from a number of sources. The silicon 103 or 203 may be scrap or discarded silicon from manufacturing solar cell panels, semiconductor wafers or shaping ingots, for example. Often the silicon 103 or 203 is part of a slurry. The slurry may include water, polyethylene glycol (PEG), silicon carbide, iron, aluminum, calcium, copper and other contaminants. The silicon 103 or 203 may be removed from the slurry (e.g., separated) and dried to remove excess water. The powder may be separated from the slurry by centrifuge, settling or other processes. Adding water to the slurry can lower the specific gravity to help improve the settling or centrifuging. The silicon 103 or 203 may undergo further processing to remove contaminants, such as by undergoing an acid treatment, for example. For example, hydrochloric acid can be used to dissolve the metals, such as iron, off of the surface of the silicon powder. Hydrofluoric acid, hydrochloric acid, nitric acid or a combination thereof may be used to dissolve silicon dioxide off of the surface of the powder or to dissolve the surface of the powder. Alternatively, potassium hydroxide, sodium hydroxide or a combination thereof may be used to dissolve the surface of the powder. The powder may also be treated with a magnetic separating process to remove iron and other magnetic elements.

Specifically, the silicon 103 or 203 can include metallurgical grade (MG) silicon. Alternatively, the silicon 103 or 203 can be of a grade or quality that is below metallurgical grade (MG) silicon. Employing less pure silicon (e.g., silicon of a grade or quality that is below metallurgical grade (MG) silicon) can provide cost-savings, as well as allowing for the use of silicon that would otherwise not be feasible or practical.

The molten liquid and slag 109 or 209 can be formed by: (i) heating silicon sufficient to form a molten liquid, and subsequently adding the flux (FIG. 2), or (ii) forming a molten liquid by heating a combination of silicon and flux (FIG. 1). Either way, a molten liquid that includes a slag 109 or 209 can be formed. As such, the silicon 103 and flux 105 can be present, and together they can be heated 107 to form the molten liquid and slag 109 (FIG. 1). Alternatively (FIG. 2), the molten liquid 209 can be formed from silicon 203, wherein the flux 205 can subsequently be added to the molten liquid 208, thereby forming the molten liquid and slag 209.

The molten liquid 208 can be formed from silicon 203, such as by feeding into a vortex using a rotary degasser, molten metal pump, rotary furnace or by induction currents. Likewise, the molten liquid and slag 109 or 209 can be formed from silicon 103 or 203, and flux 105 or 205. The silicon 103 or 203 (and optionally flux 105 or 205) may be substantially dried and fed consistently into the vortex, thus limiting its contact with oxygen. The silicon 103 or 203 (and optionally flux 105 or 205) may be sheared into individual grains, such as by setting the mixer settings for high shear. The melting may occur under submersion in a molten bath. For example, the bath may be below the liquidus temperature and above the solidus temperature, so that it is easier to put more shear on the powder and easier to keep the powder submerged in the bath due to the increased viscosity of the bath. The furnace refractory may be low in contaminates, such as by having little to no phosphorus or boron in the material. Fused silica may be an example of an acceptable refractory. Similarly, if a rotary degasser or molten metal pump is utilized, they may be manufactured with little phosphorus or boron to minimize contamination.

The silicon 103 or 203 (and optionally flux 105 or 205) may be kept submerged by utilizing melt turbulence. The melting may occur under mixing conditions in which the temperature is maintained above the solidus temperature.

The heating 107 or 207 can be carried out in a suitable manner to achieve a temperature that will effectively form a molten liquid 208, or a molten liquid and slag 109 or 209. For example, the molten liquid and slag 109 or 209 (or molten liquid 208) can be formed at a temperature above the solidus temperature. Specifically, the molten liquid and slag 109 or 209 (or molten liquid 208) can be formed at a temperature of at least about 1450° C.

Any suitable amount or ratio of silicon 103 (or 203) and flux 105 (or 205) can be employed, provided the slag is formed and can effectively be removed from the molten liquid. For example, the silicon 103 (or 203) and flux 105 (or 205) can be employed, in a weight ratio of about 15:1 to about 10:1, silicon to flux.

The flux 105 or 205 will typically be used to remove impurities (e.g., boron-containing impurities and/or aluminum) from the silicon 103 or 203. As such, silicon 103 or 203 can be purified from boron, such that at least some of the boron is removed from the silicon 103 or 203. For example, the silicon 103 or 203 can be purified from boron, to provide purified solid silicon 121 or 221 with at least about a 30 wt. % reduction in boron. Additionally, the silicon 103 or 203 can be purified from boron, to provide purified solid silicon 121 or 221 that includes less than about 0.30 ppmw boron.

The silicon 103 or 203 can be purified from aluminum, such that at least some of the aluminum is removed from the silicon 103 or 203. For example, the silicon 103 or 203 can be purified from aluminum, to provide purified solid silicon 121 or 221 with at least about a 99.5 wt. % reduction in aluminum. Additionally, the silicon 103 or 203 can be purified from aluminum, to provide purified solid silicon 121 or 221 that includes less than about 10 ppmw aluminum.

The slag is allowed to form in the molten liquid (slag and molten liquid 109 or 209), where it can be removed 111 or 211. In specific embodiments, the slag will move toward the top of the surface of the molten liquid. In such embodiments, the slag can be removed, e.g., by skimming off the slag from the molten liquid.

The slag is allowed to form in the molten liquid. It is appreciated that those of skill in the art of metallurgical chemistry understand that in the process of forming slag in the molten liquid, matter is not being created. Instead, at least a portion of the impurities present in the molten liquid (from the silicon 103 or 203) will complex or react with the flux 105 or 205, in the molten liquid. These impurities will be transformed to a slag, that can be removed from the molten liquid.

The purified molten liquid 113 or 213 can be cooled 115 or 215 to form solid silicon 117 or 217. The cooling 115 or 215 can be carried out in any suitable manner, provided the solid silicon 117 or 217 is obtained. For example, the cooling 115 or 215 can include directionally solidifying the purified molten liquid. The directional solidification can be carried out by cooling 115 or 215 the purified molten liquid. For example, the directional solidification can be carried out by cooling 115 or 215 a bottom portion of the purified molten liquid. Additionally, the directional solidification can be carried out by cooling 115 or 215 a bottom portion of the purified molten liquid, while continuing to heat a top portion of the purified molten liquid.

Upon cooling 115 or 215, a solid silicon 117 or 217 is provided. A portion of the solid silicon 117 or 217 can be removed 119 or 219, to provide purified solid silicon 121 or 221.

In those specific embodiments in which the impurities will move toward the top of the vessel containing the purified molten liquid 113 or 213, the top portion of the solid silicon 117 or 217 can be removed (i.e., the portion of the solid silicon 117 or 217 including a significant amount of the impurities). That portion of the solid silicon 117 or 217 can be removed by any suitable means. For example, that portion of the solid silicon 117 or 217 can be mechanically removed, for example, by cutting the solid silicon 117 or 217.

In specific embodiments, the method for purifying silicon 101 or 201 can be carried out once. In alternative specific embodiments, the method for purifying silicon 101 or 201 can be carried out two or more (e.g., 2, 3 or 4) times.

Specific ranges, values, and embodiments provided below are for illustration purposes only and do not otherwise limit the scope of the disclosed subject matter, as defined by the claims. The specific ranges, values, and embodiments described below encompass all combinations and sub-combinations of each disclosed range, value, and embodiment, whether or not expressly described as such.

Specific Ranges, Values, and Embodiments

In specific embodiments, the calcium chloride is absent from the composition. In additional specific embodiments, the calcium chloride is present in the composition. In additional specific embodiments, the calcium chloride is present in up to about 6.00 wt. % of the composition. In additional specific embodiments, the calcium chloride is present in about 4.00 wt. % to about 6.00 wt. % of the composition. In additional specific embodiments, the calcium chloride is present in about 5.00 wt. %, ±20% of the composition. In additional specific embodiments, the calcium chloride is present in about 5.00 wt. %, ±10% of the composition.

In specific embodiments, the silicon dioxide is present in about 35 wt. % to about 80 wt. % of the composition. In additional specific embodiments, the silicon dioxide is present in about 35 wt. % to about 50 wt. % of the composition. In additional specific embodiments, the silicon dioxide is present in about 42.70 wt. %, ±10% of the composition. In additional specific embodiments, the silicon dioxide is present in about 42.70 wt. %, ±5% of the composition.

In specific embodiments, the sodium carbonate is present in about 45 wt. % to about 55 wt. % of the composition. In additional specific embodiments, the sodium carbonate is present in about 50.60 wt. %, ±10% of the composition. In additional specific embodiments, the sodium carbonate is present in about 50.60 wt. %, ±5% of the composition.

In specific embodiments, the calcium oxide is absent. In alternative specific embodiments, the calcium oxide is present. In additional specific embodiments, the calcium oxide is present in about 1.50 wt. % to about 1.90 wt. % of the composition. In additional specific embodiments, the calcium oxide is present in about 1.50 wt. % to about 1.90 wt. % of the composition. In additional specific embodiments, the calcium oxide is present in about 1.70 wt. %, ±10% of the composition. In additional specific embodiments, the calcium oxide is present in about 1.70 wt. %, ±5% of the composition.

In specific embodiments, the calcium fluoride is absent from the composition. In additional specific embodiments, the calcium fluoride is present in about 4.00 wt. % to about 6.00 wt. % of the composition. In additional specific embodiments, the calcium fluoride is present in up to about 6.00 wt. % of the composition. In additional specific embodiments, the calcium fluoride is present in about 5.00 wt. %, ±20% of the composition. In additional specific embodiments, the calcium fluoride is present in about 5.00 wt. %, ±10% of the composition.

In specific embodiments, the method is a method for purifying silicon. In additional specific embodiments, the method at least partially purifies silicon from aluminum. In additional specific embodiments, the method purifies silicon from aluminum. In additional specific embodiments, the method provides for silicon with at least about a 98 wt. % reduction in aluminum. In additional specific embodiments, the method provides for silicon with at least about a 99.5 wt. % reduction in aluminum. In additional specific embodiments, the method provides for silicon with at least about a 99.8 wt. % reduction in aluminum. In additional specific embodiments, the method provides for purified silicon that includes less than about 20 ppmw aluminum. In additional specific embodiments, the method provides for purified silicon that includes less than about 10 ppmw aluminum. In additional specific embodiments, the method provides for purified silicon that includes less than about 5 ppmw aluminum.

In specific embodiments, the method purifies silicon from boron. In additional specific embodiments, the method provides for silicon with at least about a 20 wt. % reduction in boron. In additional specific embodiments, the method provides for silicon with at least about a 30 wt. % reduction in boron. In additional specific embodiments, the method provides for silicon with at least about a 40 wt. % reduction in boron. In additional specific embodiments, the method provides for purified silicon that includes less than about 0.40 ppmw boron. In additional specific embodiments, the method provides for purified silicon that includes less than about 0.30 ppmw boron. In additional specific embodiments, the method provides for purified silicon that includes less than about 0.20 ppmw boron.

In specific embodiments, the method employs metallurgical grade (MG) silicon, e.g., the silicon that forms the molten liquid includes metallurgical grade (MG) silicon. In additional specific embodiments, the method employs upgraded metallurgical grade (UMG) silicon, e.g., the silicon that forms the molten liquid includes upgraded metallurgical grade (UMG) silicon. In additional specific embodiments, the method employs solar grade (SOG) silicon, e.g., the silicon that forms the molten liquid includes solar grade (SOG) silicon. In additional specific embodiments, the method employs a grade or quality of silicon that is below metallurgical grade (MG) silicon.

In additional specific embodiments, the method employs a grade or quality of silicon that is below about 98 wt. % pure. In additional specific embodiments, the method employs a grade or quality of silicon that is below about 95 wt. % pure. In additional specific embodiments, the method employs a grade or quality of silicon that is below about 90 wt. % pure. In additional specific embodiments, the method employs a grade or quality of silicon that is below about 85 wt. % pure. In additional specific embodiments, the method employs a grade or quality of silicon that is below about 80 wt. % pure. In additional specific embodiments, the method employs a grade or quality of silicon that is below about 75 wt. % pure. In additional specific embodiments, the method employs a grade or quality of silicon that is below about 70 wt. % pure. In additional specific embodiments, the method employs a grade or quality of silicon that is below about 65 wt. % pure. In additional specific embodiments, the method employs a grade or quality of silicon that is below about 60 wt. % pure.

In specific embodiments, the silicon that forms the molten liquid includes silicon recycled from a silicon purification process.

In specific embodiments, the method employs silicon 201 can include metallurgical grade (MG) silicon. In additional specific embodiments, the silicon 201 can include upgraded metallurgical grade (UMG) silicon.

In specific embodiments, forming the molten liquid from the silicon and the flux is carried out, such that a molten liquid of silicon is initially formed, and the flux is subsequently added to the molten silicon. In additional specific embodiments, forming the molten liquid from the silicon and the flux is carried out, such that solid silicon is initially contacted with the flux, and together they are heated to form the molten liquid.

In specific embodiments, the silicon and flux can be employed, in a weight ratio of about 25:1 to about 5:1, of silicon to flux. In additional specific embodiments, the silicon and flux can be employed, in a weight ratio of about 20:1 to about 7:1, of silicon to flux. In additional specific embodiments, the silicon and flux can be employed, in a weight ratio of about 15:1 to about 10:1, of silicon to flux.

In specific embodiments, the silicon and flux can be employed, in a weight ratio of at least about 5:1, of silicon to flux. In additional specific embodiments, the silicon and flux can be employed, in a weight ratio of at least about 10:1, of silicon to flux. In additional specific embodiments, the silicon and flux can be employed, in a weight ratio of at least about 15:1, of silicon to flux. In additional specific embodiments, the silicon and flux can be employed, in a weight ratio of at least about 20:1, of silicon to flux. In additional specific embodiments, the silicon and flux can be employed, in a weight ratio of at least about 25:1, of silicon to flux.

In specific embodiments, the silicon and flux can be employed, in a weight ratio of up to about 25:1, of silicon to flux. In additional specific embodiments, the silicon and flux can be employed, in a weight ratio of up to about 20:1, of silicon to flux. In additional specific embodiments, the silicon and flux can be employed, in a weight ratio of up to about 15:1, of silicon to flux. In additional specific embodiments, the silicon and flux can be employed, in a weight ratio of up to about 10:1, of silicon to flux. In additional specific embodiments, the silicon and flux can be employed, in a weight ratio of up to about 5:1, of silicon to flux.

In specific embodiments, the molten liquid is formed at a temperature of at least about 1420° C. In additional specific embodiments, the molten liquid is formed at a temperature of at least about 1450° C. In additional specific embodiments, the molten liquid is formed at a temperature of at least about 1500° C. In additional specific embodiments, the molten liquid is formed at a temperature of at least about 1550° C.

In specific embodiments, the molten liquid is formed at a temperature above the solidus temperature. In additional specific embodiments, the molten liquid is formed at a temperature above the liquidus temperature.

In specific embodiments, the slag includes a product of the flux and impurities from the silicon. In additional specific embodiments, the slag includes a reaction product of the flux and impurities from the silicon. In additional specific embodiments, the slag includes impurities from the silicon.

In specific embodiments, the slag forms on the surface of the molten liquid. In additional specific embodiments, the slag forms on the surface of the molten liquid, and is subsequently removed from the molten liquid.

In specific embodiments, the method further includes directionally solidifying the purified molten liquid, to form solid silicon. In additional specific embodiments, the directional solidification is carried out by cooling the purified molten liquid. In additional specific embodiments, the directional solidification is carried out by cooling the purified molten liquid, to a temperature of less than the liquidus temperature of the purified molten liquid. In additional specific embodiments, the purified molten liquid is cooled to above the solidus temperature of the purified molten liquid and below the liquidus temperature of the purified molten liquid.

In specific embodiments, a top portion of the purified molten liquid is maintained above the melting point, while a bottom portion of the purified molten liquid is cooled below the melting point. In additional specific embodiments, a top portion of the purified molten liquid is heated, while a bottom portion of the purified molten liquid is cooled.

In specific embodiments, the directional solidification is carried out by cooling the purified molten liquid at a bottom portion of a directional solidification mold. In additional specific embodiments, the directional solidification is carried out by cooling the purified molten liquid at a bottom portion of a directional solidification mold, and by heating the purified molten liquid at a top portion of a directional solidification mold. In additional specific embodiments, the directional solidification is carried out by cooling the purified molten liquid at a bottom portion of a directional solidification mold, at a rate of less than about 75° C./hr.

In specific embodiments, the directional solidification is carried out by cooling the purified molten liquid, to within about 125° C. above the solidus temperature of the purified molten liquid. In additional specific embodiments, the directional solidification is carried out by cooling the purified molten liquid, to within about 125° C. above the melting point of the purified molten liquid. In additional specific embodiments, the directional solidification is carried out by cooling the purified molten liquid, over a period of time of at least about 18 hours.

In specific embodiments, the flux is present on an internal surface of a vessel used to form a molten liquid that includes silicon. In additional specific embodiments, the flux is present on an internal surface of a furnace refractory. In additional specific embodiments, the flux is present on an internal surface of a vessel used to heat silicon. In additional specific embodiments, the flux is present on an internal surface of a vessel used to form a molten liquid of silicon.

In specific embodiments, the method further includes removing a portion of the solid silicon. In additional specific embodiments, the portion of the solid silicon is removed by cutting the solid silicon.

In specific embodiments, any one or more steps are independently carried, out multiple times.

In specific embodiments, the method provides for at least about 1,000 kg silicon.

In specific embodiments, the method provides for purified silicon which is suitable for the manufacture of a solar panel.

Specific enumerated embodiments [1] to [61] provided below are for illustration purposes only, and do not otherwise limit the scope of the disclosed subject matter, as defined by the claims. These enumerated embodiments encompass all combinations, sub-combinations, and multiply referenced (e.g., multiply dependent) combinations described therein.

Enumerated Embodiments

[1] A composition comprising:
(a) silicon dioxide ($SiO_2$);
(b) sodium carbonate ($Na_2CO_3$);
(c) optionally calcium oxide (CaO); and
(d) at least one of calcium fluoride ($CaF_2$) and calcium chloride ($CaCl_2$).

[2] The composition of embodiment [1], wherein the silicon dioxide is present in about 35 wt. % to about 80 wt. % of the composition.

[3.] The composition of any one of the above embodiments, wherein the silicon dioxide is present in about 40 wt. % to about 60 wt. % of the composition.

[4.] The composition of any one of the above embodiments, wherein the silicon dioxide is present in about 50 wt. %, ±50%.

[5.] The composition of any one of the above embodiments, wherein the silicon dioxide is present in about 50 wt. %, ±20%.

[6.] The composition of any one of the above embodiments, wherein the sodium carbonate is present in about 40 wt. % to about 60 wt. % of the composition.

[7.] The composition of any one of the above embodiments, wherein the sodium carbonate is present in about 40 wt. % to about 55 wt. % of the composition.

[8.] The composition of any one of the above embodiments, wherein the sodium carbonate is present in about 45 wt. % to about 55 wt. % of the composition.

[9.] The composition of any one of the above embodiments, wherein the sodium carbonate is present in about 50.60 wt. %, ±10%.

[10.] The composition of any one of the above embodiments, wherein the calcium oxide is present.

[11.] The composition of any one of the above embodiments, wherein the calcium oxide is absent.

[12.] The composition of any one of the above embodiments, wherein the calcium oxide is present in about 1.50 wt. % to about 5.5 wt. % of the composition.

[13.] The composition of any one of the above embodiments, wherein the calcium oxide is present in about 1.50 wt. % to about 1.90 wt. % of the composition.

[14.] The composition of any one of the above embodiments, wherein the calcium oxide is present in about 1.70 wt. %, +10%.

[15.] The composition of any one of the above embodiments, wherein the calcium fluoride is present in about 0.50 wt. % to about 6.00 wt. % of the composition.

[16.] The composition of any one of the above embodiments, wherein the calcium fluoride is present in about 4.00 wt. % to about 6.00 wt. % of the composition.

[17.] The composition of any one of the above embodiments, wherein the calcium fluoride is present in about 5.00 wt. %, ±20%.

[18.] The composition of any one of the above embodiments, wherein the calcium chloride is present in about 4.00 wt. % to about 6.00 wt. % of the composition.

[19.] The composition of any one of the above embodiments, wherein the calcium chloride is present in about 5.00 wt. %, ±20%.

[20.] The composition of any one of the above embodiments, wherein both the calcium fluoride and the calcium chloride are present in the composition.

[21.] A composition comprising:
(a) silicon dioxide ($SiO_2$), present in about 50 wt. %, ±50%;
(b) sodium carbonate ($Na_2CO_3$), present in about 47 wt. %, ±20%;
(c) optionally calcium oxide (CaO), present in up to about 6 wt. %; and
(d) at least one of calcium fluoride ($CaF_2$) and calcium chloride ($CaCl_2$), when present, each is independently present in up to about 5.00 wt. %.

[22.] A composition comprising:
(a) silicon dioxide ($SiO_2$), present in about 42.70 wt. %, ±10%;
(b) sodium carbonate ($Na_2CO_3$), present in about 50.60 wt. %, ±10%;
(c) calcium oxide (CaO), present in about 1.70 wt. %, ±10%;
(d) at least one of calcium fluoride ($CaF_2$) and calcium chloride ($CaCl_2$), when present, each is independently present in about 5.00 wt. %, ±20%.

[23.] A composition comprising:
(a) silicon dioxide ($SiO_2$), present in about 35 wt. % to about 80 wt. % of the composition;
(b) sodium carbonate ($Na_2CO_3$), present in about 40 wt. % to about 55 wt. % of the composition;
(c) optionally calcium oxide (CaO), present in up to about 6 wt. % of the composition; and (d) at least one of calcium fluoride ($CaF_2$) and calcium chloride ($CaCl_2$), when present, each is independently present in about 0.50 wt. % to about 6.00 wt. % of the composition.

[24.] A composition comprising:
(a) silicon dioxide ($SiO_2$), present in about 35 wt. % to about 50 wt. % of the composition;
(b) sodium carbonate ($Na_2CO_3$), present in about 45 wt. % to about 55 wt. % of the composition;
(c) calcium oxide (CaO), present in about 1.50 wt. % to about 1.90 wt. % of the composition;
(d) at least one of calcium fluoride ($CaF_2$) and calcium chloride ($CaCl_2$), when present, each is independently present in about 4.00 wt. % to about 6.00 wt. % of the composition.

[25.] A method comprising:
(a) forming a molten liquid from silicon and a flux, the flux comprising the composition of any one of embodiments [1]-[24];
(b) forming a slag, from the flux and impurities in the molten liquid and; and
(c) optionally removing at least a portion of the slag from the molten liquid, to provide a purified molten liquid.

[26.] The method of embodiment [25], which is a method for purifying silicon.

[27.] The method of any one of the above embodiments, which purifies silicon from aluminum.

[28.] The method of any one of the above embodiments, which provides for silicon with at least about a 99.5 wt. % reduction in aluminum.

[29.] The method of any one of the above embodiments, which provides for silicon comprising less than about 10 ppmw aluminum.

[30.] The method of any one of the above embodiments, which purifies silicon from boron.

[31.] The method of any one of the above embodiments, which purifies silicon from aluminum.

[32.] The method of any one of the above embodiments, which provides for silicon with at least about a 30 wt. % reduction in boron.

[33.] The method of any one of the above embodiments, which provides for silicon comprising less than about 0.30 ppmw boron.

[34.] The method of any one of the above embodiments, wherein the silicon that forms the molten liquid comprises metallurgical grade (MG) silicon.

[35.] The method of any one of the above embodiments, wherein the silicon that forms the molten liquid comprises solar grade (SOG) silicon.

[36.] The method of any one of the above embodiments, wherein the silicon that forms the molten liquid comprises silicon recycled from a silicon purification process.

[37.] The method of any one of the above embodiments, wherein forming the molten liquid from the silicon and the flux is carried out, such that a molten liquid of silicon is initially formed, and the flux is subsequently added to the molten silicon.

[38.] The method of any one of the above embodiments, wherein forming the molten liquid from the silicon and the flux is carried out, such that solid silicon is initially contacted with the flux, and together they are heated to form the molten liquid.

[39.] The method of any one of the above embodiments, wherein the molten liquid is formed at a temperature of at least about 1450° C.

[40.] The method of any one of the above embodiments, wherein the molten liquid is formed at a temperature above the solidus temperature.

[41.] The method of any one of the above embodiments, wherein the slag comprises a reaction product of the flux and impurities from the silicon.

[42.] The method of any one of the above embodiments, wherein the slag comprises impurities from the silicon.

[43.] The method of any one of the above embodiments, wherein slag forms on the surface of the molten liquid.

[44.] The method of any one of the above embodiments, wherein slag forms on the surface of the molten liquid, and is subsequently removed from the molten liquid.

[45.] The method of any one of the above embodiments, further comprising (d) directionally solidifying the purified molten liquid, to form solid silicon.

[46.] The method of any one of the above embodiments, wherein the flux is present on an internal surface of a furnace refractory, which is configured to protect molten silicon from contamination by impurities from the furnace refractory.

[47.] The method of any one of the above embodiments, wherein the directional solidification is carried out by cooling the purified molten liquid.

[48.] The method of any one of the above embodiments, wherein the directional solidification is carried out by cooling the purified molten liquid, to a temperature of less than the liquidus temperature of the purified molten liquid.

[49.] The method of any one of the above embodiments, wherein the purified molten liquid is cooled to above the solidus temperature of the purified molten liquid and below the liquidus temperature of the purified molten liquid.

[50.] The method of any one of the above embodiments, wherein a top portion of the purified molten liquid is maintained above the melting point, while a bottom portion of the purified molten liquid is cooled below the freezing point.

[51.] The method of any one of the above embodiments, wherein the directional solidification is carried out by cooling the purified molten liquid, to within about 125° C. above the solidus temperature of the purified molten liquid.

[52.] The method of any one of the above embodiments, wherein the directional solidification is carried out by cooling the purified molten liquid, to within about 125° C. above the melting point of the purified molten liquid.

[53.] The method of any one of the above embodiments, wherein the directional solidification is carried out by cooling the purified molten liquid at a bottom portion of a directional solidification mold.

[54.] The method of any one of the above embodiments, wherein the directional solidification is carried out by cooling the purified molten liquid at a bottom portion of a directional solidification mold, at a rate of less than about 75° C./hr.

[55.] The method of any one of the above embodiments, wherein the directional solidification is carried out by cooling the purified molten liquid, over a period of time of at least about 18 hours.

[56.] The method of any one of the above embodiments, further comprising (e) removing a portion of the solid silicon, to provide purified solid silicon.

[57.] The method of any one of the above embodiments, wherein the portion of the solid silicon is removed by cutting the solid silicon.

[58.] The method of any one of the above embodiments, wherein any one or more steps is independently carried out multiple times.

[59.] The method of any one of the above embodiments, which provides for at least about 1,000 kg silicon.

[60.] The method of any one of the above embodiments, wherein the purified solid silicon is employed in the manufacture of a solar panel.

[61.] A method comprising:
(a) forming a molten liquid from silicon and a flux, the flux comprising the composition of any one of embodiments [1]-[24];
(b) forming a slag, from the flux and impurities in the molten liquid;
(c) optionally removing at least a portion of the slag from the molten liquid;
(d) directionally solidifying the molten liquid, to form solid silicon; and
(e) removing a portion of the solid silicon, to provide purified solid silicon.

The invention claimed is:

1. A method comprising:
(a) forming a molten liquid from silicon and a flux composition, the flux composition comprising silicon dioxide ($SiO_2$), sodium carbonate ($Na_2CO_3$), calcium oxide (CaO) present in an amount that is between 1.50 wt. % to 1.90 wt. % of the flux composition, and at least one of calcium fluoride ($CaF_2$) and calcium chloride ($CaCl_2$);
(b) forming a slag, from the flux composition and impurities in the molten liquid; and
(c) optionally removing at least a portion of the slag from the molten liquid, to provide a purified molten liquid.

2. The method of claim 1, which provides for silicon with at least about a 99.5 wt. % reduction in aluminum compared to the amount of aluminum in the silicon used to form the molten liquid.

3. The method of claim 1, which provides for silicon comprising less than about 10 ppmw aluminum.

4. The method of claim 1, wherein the method purifies silicon from aluminum and boron.

5. The method of claim 1, wherein forming the molten liquid from the silicon and the flux composition comprises one of:
initially forming a molten liquid of silicon and subsequently adding the flux composition to the molten silicon, or
initially contacting solid silicon with the flux composition and heating both the solid silicon and the flux composition to form the molten liquid.

6. The method claim 1, further comprising (d) directionally solidifying the purified molten liquid, to form solid silicon.

7. The method of claim 1, wherein the flux composition is present on an internal surface of a furnace refractory prior to forming a molten liquid.

8. The method claim 6, further comprising (e) removing a portion of the solid silicon, to provide purified solid silicon.

9. The method of claim 1, wherein any one or more steps is independently carried out multiple times.

10. The method of claim 1, wherein the silicon dioxide ($SiO_2$) is present in an amount that is between 25 wt. % to 75 wt. % of the flux composition, the sodium carbonate ($Na_2CO_3$) is present in an amount that is between 37.6 wt. % to 56.4 wt. % of the flux composition, and the calcium fluoride ($CaF_2$) and the calcium chloride ($CaCl_2$) are, when present, each independently present in an amount that is up to 6.00 wt. % of the flux composition.

11. The method of claim 10, wherein the silicon dioxide ($SiO_2$) is present in an amount that is between 35 wt. % and 50 wt. %.

12. The method of claim 1, wherein the silicon dioxide ($SiO_2$) is present in an amount that is between 38.43 wt. % to 46.97 wt. % of the flux composition, the sodium carbonate ($Na_2CO_3$) is present in an amount that is between 45.54 wt. % to 55.66 wt. % of the flux composition, the calcium oxide (CaO) is present in an amount that is between 1.53 wt. % to 1.87 wt. % of the flux composition, and the calcium fluoride ($CaF_2$) and the calcium chloride ($CaCl_2$) are, when present, each independently present in an amount that is between 4.00 wt. % to 6.00 wt. % of the flux composition.

13. The method of claim 1, wherein the silicon dioxide ($SiO_2$) is present in an amount that is between 35 wt. % and 80 wt. % of the flux composition, the sodium carbonate ($Na_2CO_3$) is present in an amount that is between 40 wt. % and 55 wt. % of the flux composition, and the calcium fluoride ($CaF_2$) and the calcium chloride ($CaCl_2$) are, when present, each independently present in an amount that is between 0.50 wt. % and 6.00 wt. % of the flux composition.

14. The method of claim 13, wherein the silicon dioxide ($SiO_2$) is present in an amount that is between 35 wt. % and 50 wt. %.

15. The method of claim 1, wherein the silicon dioxide ($SiO_2$) is present in an amount that is between 35 wt. % and 50 wt. % of the flux composition, the sodium carbonate ($Na_2CO_3$) is present in an amount that is between 45 wt. % and 55 wt. % of the flux composition, and the calcium fluoride ($CaF_2$) and the calcium chloride ($CaCl_2$) are, when present, each independently present in an amount that is between 4.00 wt. % and 6.00 wt. % of the flux composition.

16. The method of claim 1, wherein the silicon dioxide ($SiO_2$) is present in an amount that is between 40.565 wt. % to 44.835 wt. % of the flux composition, the sodium carbonate ($Na_2CO_3$) is present in an amount that is between 48.07 wt. % to 53.13 wt. % of the flux composition, the calcium oxide (CaO) is present in an amount that is between 1.615 wt. % to 1.785 wt. % of the flux composition, and the calcium fluoride ($CaF_2$) and the calcium chloride ($CaCl_2$) are, when present, each independently present in an amount that is between 4.50 wt. % to 5.50 wt. % of the flux composition.

17. The method of claim 16, wherein the calcium fluoride ($CaF_2$) and the calcium chloride ($CaCl_2$) are both present in the flux composition.

18. A method comprising:
(a) forming a molten liquid from silicon and a flux composition, the flux composition comprising silicon dioxide ($SiO_2$) present in an amount that is between 35 wt. % to 50 wt. % of the flux composition, sodium carbonate ($Na_2CO_3$) present in an amount that is between 45 wt. % to 55 wt. % of the flux composition, calcium chloride ($CaCl_2$) present in an amount that is between 4.00 wt. % to 6.00 wt. % of the flux composition, calcium oxide (CaO) present in an amount that is between 1.50 wt. % to 1.90 wt. % of the flux composition, and optionally calcium fluoride ($CaF_2$), wherein the calcium fluoride is, when present, present in an amount that is between 4.00 wt. % to 6.00 wt. % of the flux composition;
(b) forming a slag, from the flux composition and impurities in the molten liquid; and
(c) optionally removing at least a portion of the slag from the molten liquid, to provide a purified molten liquid.

19. The method of claim 18, wherein the silicon dioxide ($SiO_2$) is present in an amount that is between 40.565 wt. % to 44.835 wt. % of the flux composition, the sodium carbonate ($Na_2CO_3$) is present in an amount that is between 48.07 wt. % to 53.13 wt. % of the flux composition, the calcium chloride ($CaCl_2$) is present in an amount that is between 4.50 wt. % to 5.50 wt. % of the flux composition, the calcium oxide (CaO) is present in an amount that is between 1.615 wt. % to 1.785 wt. % of the flux composition, and the calcium fluoride ($CaF_2$) is, when present, present in an amount that is between 4.50 wt. % to 5.50 wt. % of the flux composition.

20. The method of claim 19, wherein the calcium fluoride ($CaF_2$) is present in the flux composition.

\* \* \* \* \*